United States Patent [19]

Kölpin

[11] Patent Number: 4,575,641

[45] Date of Patent: Mar. 11, 1986

[54] CIRCUIT ARRANGEMENT FOR REDUCING THE RESIDUAL VOLTAGE ON PARTIALLY DISCONNECTED LOADS

[75] Inventor: Thomas Kölpin, Amberg, Fed. Rep. of Germany

[73] Assignee: Siemens Aktiengesellschaft, Munich and Berlin, Fed. Rep. of Germany

[21] Appl. No.: 614,073

[22] Filed: May 25, 1984

[30] Foreign Application Priority Data

Jun. 10, 1983 [DE] Fed. Rep. of Germany ....... 3321086

[51] Int. Cl.⁴ ............................................. H01H 47/00
[52] U.S. Cl. ..................................... 307/38; 361/152; 361/187; 307/100
[58] Field of Search ................ 307/38, 100, 130, 327, 307/491, 101, 501, 568; 361/152, 160, 187, 191; 323/223

[56] References Cited

U.S. PATENT DOCUMENTS 3,790,862  2/1974  Kampf et al. ........................ 361/152
4,418,374  11/1983  Callan .................................. 361/187

*Primary Examiner*—A. D. Pellinen
*Assistant Examiner*—T. DeBoer
*Attorney, Agent, or Firm*—F. W. Powers; J. L. James

[57] ABSTRACT

This invention is concerned with a circuit arrangement for reducing the residual voltage on partially disconnected loads, such as control coils of electromagnetic switchgear having long control lines, by connecting an auxiliary load in parallel to the load. According to the invention, a constant-current sink is connected in parallel to the load as an additional load, which is dependent on a control circuit that the circuit closes when the applied voltage is below a predetermined value and breaks when it exceeds a predetermined value.

12 Claims, 9 Drawing Figures

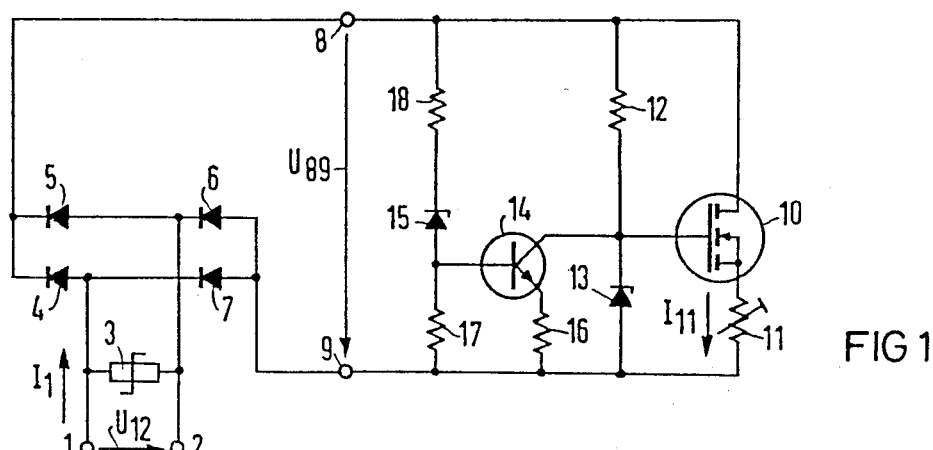
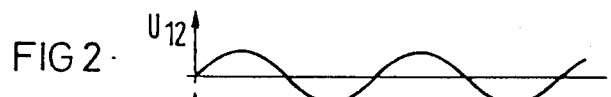
FIG 2
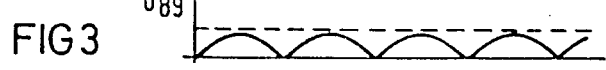
FIG 3
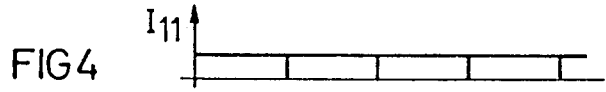
FIG 4
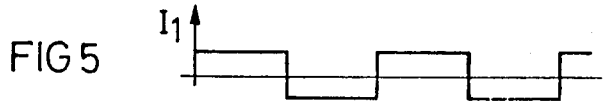
FIG 5
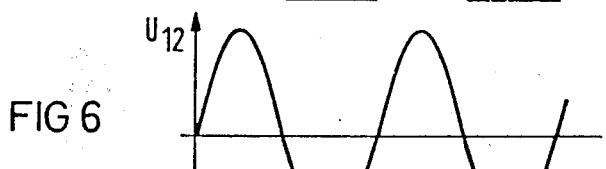
FIG 6
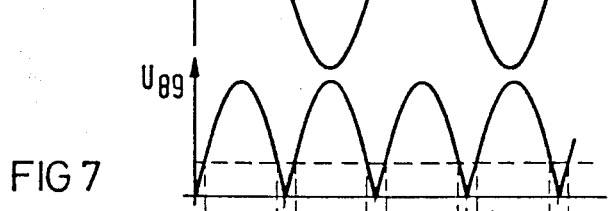
FIG 7
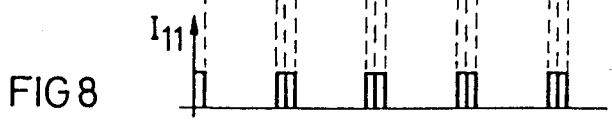
FIG 8
FIG 9

CIRCUIT ARRANGEMENT FOR REDUCING THE RESIDUAL VOLTAGE ON PARTIALLY DISCONNECTED LOADS

BACKGROUND OF THE INVENTION

This invention relates to a circuit arrangement for reducing the residual voltage on partially disconnected loads, such as control coils of electromagnetic switchgears with long control lines, by connecting an additional load in parallel.

Residual voltages of this type are generated by resistive, capacitive, or inductance coupling. They appear particularly in the case of magnetic coils energized by AC current, such as the contactor's driving magnet, which must be actuated via long control lines. After the control switch disconnects, there occurs a capacitive leakage current which, in the case of a sufficiently high line capacitance, can be so high that the consequent residual voltage exceeds the bias of the magnet coil, so that a proper de-energizing of the magnet coil is prevented. This phenomenon may also occur when electronic output stages are used as control switch whose power semiconductors are wired up with RC-networks.

In the case of the familiar circuit arrangements of the type described above (Schmelcher, T., "Handbuch der Niederspannung", Berlin-Munich 1982, pp. 148, 149) the additional resistive or capacitive loads are connected in parallel to the magnetic coils whose current consumption causes a drop in the residual voltage below the bias value of the magnet when the control switch is disconnected. If additional resistive loads are being used, considerable power losses occur in the on-position. When additional capacitive loads are connected to the load, the undesirable phenomena of resonance may occur. Furthermore, if we are to obtain an adequate effect, high capacitance values are required which are both costly and space-consuming.

SUMMARY OF THE INVENTION

It is the object of the present invention to improve the circuit arrangement for reducing residual voltages so that while fewer components are used, the residual voltages on partially disconnected loads are reduced, and power losses are kept to a minimum when applying operating voltage. This is achieved simply by using the additional load as a constant current sink. Contrary to existing additional loads, with the applied voltage the power loss increase is no longer quadratic, but linear. For a further improvement, when the constant-current sink is dependent on the control circuit, it is advantageous for the circuit to close when the instantaneous value of the applied voltage falls below a predetermined value, and break when the voltage exceeds a predetermined value. In the existing circuit the constant-current sink can be constructed with a transistor and Zener diode (Tietze und Schenk, "Halbleiterschaltungstechnik", Berlin, Heidelberg, New York 1974, p. 116) while, in order to obtain very low gate power losses, it is also advantageous to install a compound-connected Darlington or power-field-effect transistor. To adjust the constant-current value, it is recommended that the emitter resistor or source resistor of the transistor be at least partly adjustable. If the circuit arrangement is used in an AC network, the circuit should be connected via a bridge rectifier. A further advantage results when the components are connected before the constant-current sink to limit voltage surges and thereby avoid the destruction of the transistors caused by unfavorable conditions. As a control circuit for the familiar constant-current sink, it has also proved advantageous to have the series circuit made of the collector-emitter path of a n-p-n transistor and an emitter-resistor, connected to the Zener diode of the familiar constant-current sink, which determines the base or gate potential of the compound-connected or power-field-effect transistor. The automatic control of the control circuit can be realized quite simply in the case of a specific voltage when the base terminal of the n-p-n transistor is connected through a Zener diode and a series resistor to the collector or drain terminal of the compound-connected (Darlington) or field-effect transistor of the constant-current sink and through another resistance to the reference potential. To obtain an optimal symmetry of the achieved types of current at high voltages, it is advantageous if the series resistor of the Zener diode is subdivided and a capacitor is connected in parallel to one of the subresistors.

To avoid transient instabilities it is also advantageous if a capacitor is connected in parallel to the resistor between the base of the n-p-n transistor and the reference potential.

Other features and advantages of the present invention will become apparent from the following detailed description, and from the claims.

For a full understanding of the present invention, reference should now be made to the following detailed description and to the accompanying drawings.

BRIEF DESCRIPTION OF THE DRAWINGS

FIG. 1 shows schematically an embodiment of the circuit according to the invention.

FIGS. 2 to 9 show diagrams of the voltage and current curves of the load as a function of time.

DETAILED DESCRIPTION

According to the circuit diagram in FIG. 1, terminals 1 and 2 are connected to the wired load, which in this case is contactor coil 19. Varistor 3 serves to limit the overvoltage. After passing through the bridge rectifier (diodes 4, 5, 6, and 7), the AC voltage applied between terminals 1 and 2 appears between terminals 8 and 9 as a two-pulse rectified AC voltage. Thus it is being applied to the constant-current sink formed by transistor 10 (power-field-effect transistor or compound-connected transistor), emitter resister 11, series resistor 12, and Zener diode 13. If n-p-n transistor 14 is cut off, a current appears through resistor 11 which, as is known, is almost independent of the time fluctuations of the voltage between terminals 8 and 9. If the voltage between terminals 8 and 9 exceeds the voltage in Zener diode 15 in addition to the base-emitter-threshold voltage of transistor 14, the latter will be activated so as to obtain a low-resistance leakage by-pass to Zener diode 13. Due to high-value series resistor 12, the voltage fails at Zener diode 13 and the constant-current sink is cut off. Resistors 16, 17, and 18 serve to adjust the operating points of transistor 14; resistor 18 also limits the maximum current flow through Zener diode 15. Contactor coil 19 is connected with voltage source 21 through long lines 20 by closing switch 22. When switch 22 has been opened, capacitors 23, indicated by dotted lines between long lines 20, can cause the voltage at contactor coil 19 to remain at such a high level that a de-energizing of the magnet coil is prevented without using an additional load, as in the case of the circuit described above.

To expand the circuit illustrated, resistor 18 can be subdivided (resistors 18.1 and 18.2, shown as dotted lines), and a capacitor 18.3 (also indicated by dotted lines) can be connected in parallel to one of the resistors 18.2 so as to optimize the symmetry of the obtained current waveforms at high operating voltages. Additionally, to prevent transient instabilities, a capacitor 24 (also indicated by dotted lines) can be connected in parallel with resistor 17.

FIGS. 2 through 9 illustrate some of the voltage and current curves as functions of time, to explain the mode of operation of the arrangement contained in this invention.

FIG. 2 shows a low voltage $U_{12}$ between terminals 1 and 2. After retification, voltage $U_{89}$ is obtained between terminals 8 and 9, as shown in FIG. 3. Its amplitude lies below the switching threshold (indicated as a dotted line) of transistor 14; the current source is always on. The current $I_{11}$ takes the form illustrated in FIG. 4; on the AC current side of the rectifier the current $I_1$ appears as illustrated in FIG. 5. The R.M.S. value of current $I_1$ is high; the circuit represents a low-load impedance.

FIGS. 6 through 9 illustrate the corresponding current and voltage forms for a high voltage ($U_{12}$) whose amplitude is above the switching threshold (dotted line) of transistor 14. In comparison to FIG. 5, FIG. 9 shows that although the amplitude of the current $I_1$ has remained stable, its R.M.S. value has decreased considerably as there is only a short current flow period. The circuit thus represents a high load impedance.

If during this stage control switch 22 is turned off, and if there is, for instance, a capacitive shunt 23 to the control switch, the absolute phase position and amplitude of voltage $U_{12}$ will change. Next time the switching threshold falls below the predetermined value, the constant-current sink is reconnected causing the residual voltage $U_{12}$ to fall, due to the high capacitive pre-impedance. At the same time, this condition remains stable. Whether the initial level of the constant current will still be achieved depends on the voltage and frequency of the AC voltage supplied and on the size of the capacitive shunt. After control switch 22 has been reconnected the constant-current source is periodically switched off and on when the switching threshold has been reached, so that the initial stage is reestablished.

In the illustration of current curve $I_1$ as a function of time, the small values of the control currents through the high-valued resistors 12 and 18 were omitted.

With the circuit disclosed by the present invention, load impedances can be obtained that are so low when control switch 22 is off, that if they were to be realized conventionally with an additional resistive load, the losses occurring in the case of nominal voltage during closed circuit position, would be higher by a factor of 1000.

There has thus been shown and described a circuit arrangement for reducing the residual voltage on partially disconnected loads which fulfills all the objects and advantages sought therefor. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

What is claimed is:

1. In a circuit arrangement for reducing the residual voltage on partially disconnected load, by connecting an additional load in parallel to the load, the improvement wherein the additional load is a constant-current sink.

2. The circuit arrangement of claim 1, wherein said partially disconnected load is a control coil on electromagnetic switchgear having long control lines.

3. The circuit arrangement according to claim 1, wherein the sink is dependent on a control circuit such that the circuit closes when the applied voltage is below a predetermined value and breaks when it exceeds a predetermined value.

4. The circuit arrangement according to claim 1, wherein the constant-current sink contains a compound-connected transistor.

5. The circuit arrangement according to claim 1, wherein the constant-current sink contains a power field-effect transistor.

6. The circuit arrangement according to claim 1, further comprising a bridge-connected rectifier connected before the constant-current sink.

7. The circuit arrangement according to claim 1, wherein components are connected before the constant-current sink for the purpose of limiting the overvoltage.

8. The circuit arrangement according to claim 3, wherein a series circuit made of the collector-emitter path of n-p-n transistor and an emitter resistor is connected to a Zener diode of a constant-current sink, which determines the base or gate potential of a compound-connected or a power-field-effect transistor.

9. The circuit arrangement according to claim 8, wherein the base terminal of the n-p-n transistor is connected via a Zener diode and a series resistor with the collector or drain terminal of the compound-connected or power field effect transistor of the constant-current sink, and through a resistor with the reference potential.

10. The circuit arrangement according to claim 9, wherein the series resistor of the Zener diode is subdivided and a capacitor is connected in parallel to one of the subresistors.

11. The circuit arrangement according to claim 9, wherein a capacitor is connected in parallel to the resistor between the base of the n-p-n transistor and the reference potential.

12. The circuit arrangement of claim 1, wherein said partially disconnected load is a control coil on electromagnetic switchgear being controlled by electronic means, which are bypassed by RC-snubber networks.

* * * * *

UNITED STATES PATENT AND TRADEMARK OFFICE
CERTIFICATE OF CORRECTION

PATENT NO. : 4,575,641

DATED : March 11, 1986

INVENTOR(S) : T. Koelpin

It is certified that error appears in the above-identified patent and that said Letters Patent are hereby corrected as shown below:

On page 1 below the Abstract, please delete "9" before "Drawing" and substitute "13".
On pages 2, 3, 4 and 5, please add figures 10, 11, 12 and 13.
In column 1 line 23, before "control switch" add --a--.
In column 2 line 38, please add:
    Fig. 10 shows an embodiment similar to Fig. 1, but having a divided resistor, 18;
    Fig. 11 shows an embodiment as shown in Fig. 10, but with a capacitor paralleling one of the divided resistors;
    Fig. 12 shows an embodiment similar to Fig. 1, but having a capacitor paralleling resistor 17; and
    Fig. 13 shows an embodiment similar to Fig. 1, but using a Darlington transistor for power switch 10.
In column 2 line 48, please delete "(power-field-effect transistor or compound-connected transistor)," and add --power-field-effect transistor, (or as shown in Fig. 13 a compound-connected transistor),--.
In column 3 line 3, after "illustrated", please add --in Fig. 1,--; on lines 4 and 5 please delete "(resistors 18.1 and 18.2 shown as dotted lines)," and add --, as shown in Figs. 10 and 11, into resistors 18.1 and 18.2,--; on lines 5 and 6 please delete "(also indicated by dotted lines)" and add --as shown in Fig. 11--; and on line 10 please delete "(also indicated by dotted lines)" and add --, as shown in Fig. 13,--.

UNITED STATES PATENT AND TRADEMARK OFFICE
CERTIFICATE OF CORRECTION

PATENT NO. : 4,575,641
DATED : March 11, 1986
INVENTOR(S) : T. Koelpin

It is certified that error appears in the above-identified patent and that said Letters Patent are hereby corrected as shown below:

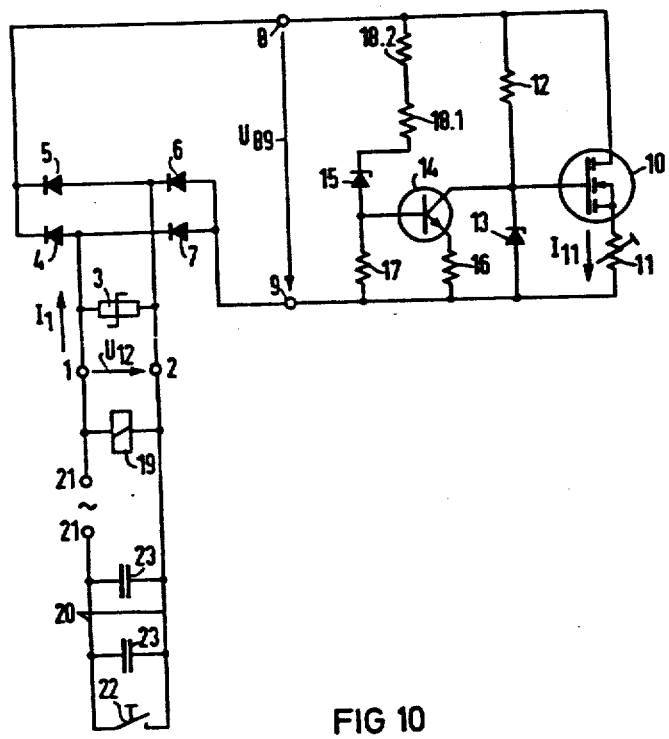

FIG 10

UNITED STATES PATENT AND TRADEMARK OFFICE
CERTIFICATE OF CORRECTION

PATENT NO. : 4,575,641
DATED : March 11, 1986
INVENTOR(S) : T. Koelpin

It is certified that error appears in the above-identified patent and that said Letters Patent are hereby corrected as shown below:

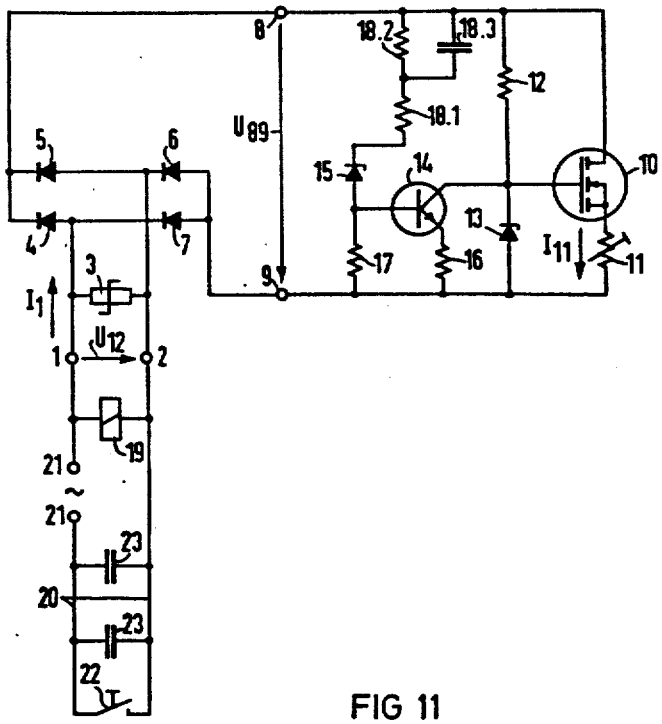

FIG 11

UNITED STATES PATENT AND TRADEMARK OFFICE
CERTIFICATE OF CORRECTION

PATENT NO. : 4,575,641
DATED : March 11, 1986
INVENTOR(S) : T. Koelpin

It is certified that error appears in the above-identified patent and that said Letters Patent are hereby corrected as shown below:

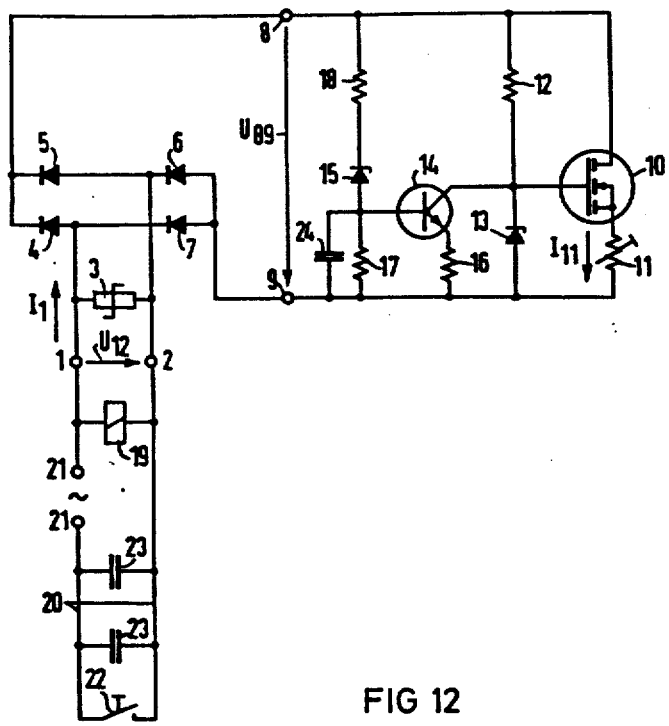

FIG 12

UNITED STATES PATENT AND TRADEMARK OFFICE
CERTIFICATE OF CORRECTION

PATENT NO. : 4,575,641
DATED : March 11, 1986
INVENTOR(S) : T. Koelpin

It is certified that error appears in the above-identified patent and that said Letters Patent are hereby corrected as shown below:

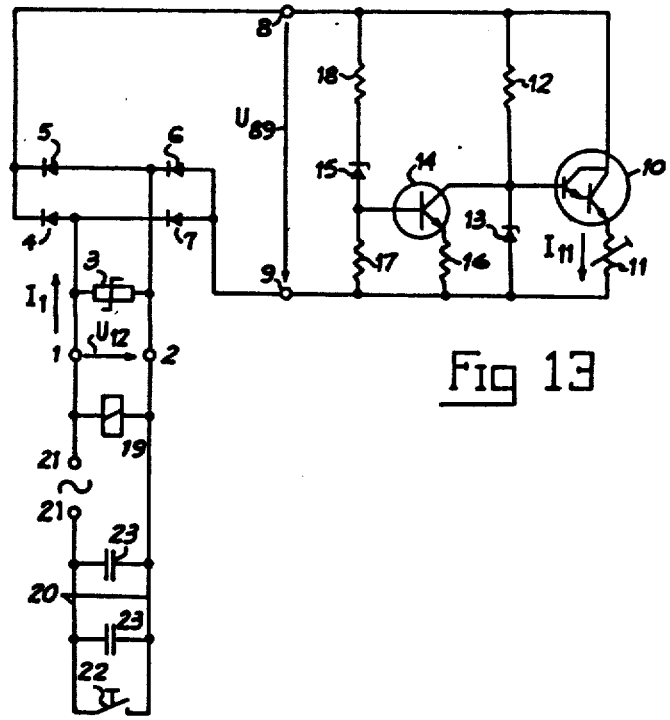

Fig 13

Signed and Sealed this

Twenty-fourth Day of June 1986

[SEAL]

Attest:

DONALD J. QUIGG

Attesting Officer

Commissioner of Patents and Trademarks